(12) United States Patent
Ying

(10) Patent No.: US 9,461,490 B2
(45) Date of Patent: Oct. 4, 2016

(54) METHOD AND APPARATUS FOR EVALUATING A RECHARGEABLE BATTERY

(71) Applicant: GM GLOBAL TECHNOLOGY OPERATIONS LLC, Detroit, MI (US)

(72) Inventor: Ramona Y. Ying, Rochester Hills, MI (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 720 days.

(21) Appl. No.: 13/801,987

(22) Filed: Mar. 13, 2013

(65) Prior Publication Data

US 2014/0266060 A1     Sep. 18, 2014

(51) Int. Cl.
*H02J 7/00*       (2006.01)
*G01R 31/36*   (2006.01)

(52) U.S. Cl.
CPC .......... *H02J 7/0047* (2013.01); *G01R 31/361* (2013.01); *G01R 31/3651* (2013.01); *G01R 31/3679* (2013.01)

(58) Field of Classification Search
CPC .............. H02J 7/0047; G01R 31/361; G01R 31/3651; G01R 31/3679

USPC ......................................................... 320/134
See application file for complete search history.

(56) References Cited

U.S. PATENT DOCUMENTS

| | | | |
|---|---|---|---|
| 2006/0208701 A1* | 9/2006 | Mikhaylik | H01M 4/5815 320/128 |
| 2011/0012604 A1* | 1/2011 | Tsujiko | H01M 10/48 324/427 |
| 2011/0193529 A1* | 8/2011 | Nishimura | H01M 4/587 320/134 |
| 2012/0100403 A1* | 4/2012 | Wang | H01M 4/133 429/50 |
| 2012/0105069 A1* | 5/2012 | Wang | G01R 31/3679 324/427 |
| 2012/0133331 A1* | 5/2012 | Ling | G01R 31/3651 320/132 |
| 2013/0169235 A1* | 7/2013 | Patino | G01R 31/361 320/136 |

* cited by examiner

*Primary Examiner* — Nathaniel Pelton

(57) ABSTRACT

A method for evaluating a battery employed in an application includes calculating a differential voltage during a charging event, evaluating the differential voltage to determine a peak state of the differential voltage, determining a state of charge of the battery based upon the peak state of the differential voltage, and controlling operation of the application in response to the state of charge.

4 Claims, 4 Drawing Sheets

METHOD AND APPARATUS FOR EVALUATING A RECHARGEABLE BATTERY

TECHNICAL FIELD

This disclosure is related to systems employing rechargeable batteries and associated control systems.

BACKGROUND

Batteries are electrochemical devices that are employed in various systems to provide electric energy from chemical reactions occurring in cells and are preferably rechargeable. Batteries are employed in various systems, including, e.g., ground vehicles. Known battery technologies include lithium iron phosphate ($LiFePO_4$) cells and other technologies that exhibit a flat voltage response during charge/discharge events. A flat voltage response during charge/discharge events makes predicting a state of charge (SOC) difficult except at the end points near the top and bottom of charge. Known systems for monitoring SOC use coulomb counting and rely on the end points to reset the SOC. Battery charging and discharging can cause phase transitions in the active materials that correlate to intercalation and de-intercalation as the battery discharges and charges.

Known vehicle systems include powertrain systems that provide tractive torque for propulsion, with some of the tractive effort originating from a battery. Such powertrain systems may include hybrid systems, all-electric systems, and extended-range electric systems that can be configured to operate in various operating modes to generate and transfer torque to a driveline.

SUMMARY

A method for evaluating a battery employed in an application includes calculating a differential voltage during a charging event, evaluating the differential voltage to determine a peak state of the differential voltage, determining a state of charge of the battery based upon the peak state of the differential voltage, and controlling operation of the application in response to the state of charge.

BRIEF DESCRIPTION OF THE DRAWINGS

One or more embodiments will now be described, by way of example, with reference to the accompanying drawings, in which:

FIG. 2-1 illustrates data associated with charging and discharging a representative battery at different states of health, in accordance with the disclosure;

FIG. 2-2 illustrates the data of FIG. 2-1, with the data expanded to include a measured voltage in relation to a percent of initial capacity for battery charging events and battery discharging events, in accordance with the disclosure;

FIG. 2-3 illustrates the data of FIG. 2-1, with the data analyzed to encompass a derivative of the voltage response with respect to the charge input plotted in relation to a state of charge of the battery, in accordance with the disclosure;

FIG. 2-4 illustrates the data of FIG. 2-1, with the data analyzed to encompass the derivative of the voltage response with respect to the charge input plotted in relation to the battery charge capacity, in accordance with the disclosure; and FIG. 3 illustrates a differential voltage analysis scheme executing a differential voltage analysis during a battery charging event, in accordance with the disclosure.

DETAILED DESCRIPTION

Figure 1:
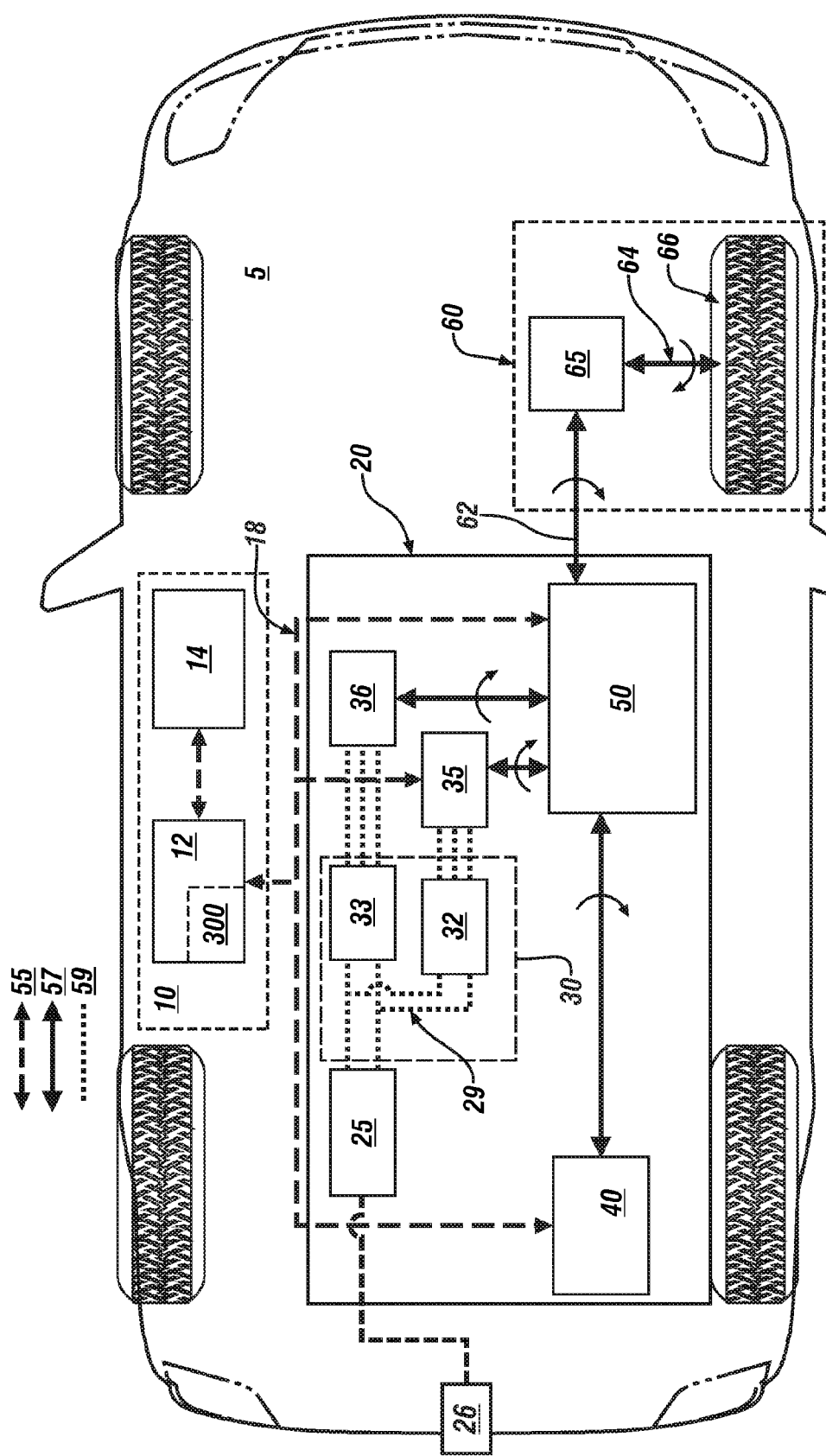
FIG. 1 illustrates a vehicle including a powertrain system employing a rechargeable battery, in accordance with the disclosure.

Referring now to the drawings, wherein the showings are for the purpose of illustrating certain exemplary embodiments only and not for the purpose of limiting the same, FIG. 1 schematically illustrates a non-limiting application employing a rechargeable energy storage device (battery) 25. The application includes a vehicle 5 including a non-limiting embodiment of a powertrain system 20 including an internal combustion engine (engine) 40, first and second non-combustion torque machines 35 and 36 and the battery 25.

The battery 25 may be any suitable energy storage device, e.g., a high-voltage battery fabricated from a plurality of lithium-ion cells. It is appreciated that the energy storage device 25 may include a plurality of electrical cells, ultracapacitors, and other suitable electrochemical devices configured to store energy and provide electric energy on-vehicle. The battery 25 electrically connects via a high-voltage bus 29 to an inverter module 30 that connects to the first and second torque machines 35 and 36 to transfer electric power therebetween. In one embodiment, an external connector 26 electrically connects to the battery 25 and is connectable to an external AC power source to provide electric power for charging the battery 25.

The engine 40 and non-combustion torque machines 35 and 36 mechanically couple to a transmission 50 that mechanically couples to a driveline 60, all of which may be controlled by a control system 10. The powertrain system 20 may be configured as a hybrid system (including one of a series-hybrid system, a parallel-hybrid system, and a compound-hybrid system), an extended-range electric system (EREV), a plug-in hybrid-electric (PHEV) vehicle, a battery electric vehicle (BEV), or another powertrain configuration without limitation. The embodiment of the vehicle 5 including the powertrain system 20 is illustrative and not limiting.

The powertrain system 20 employs communications paths 55, mechanical power paths 57, and high-voltage electric power paths 59. The mechanical power paths 57 mechanically couple elements that generate, use, and/or transfer torque. The high-voltage electric power paths 59 electrically connect elements that generate, use, and/or transfer high-voltage electric power, including the high-voltage DC bus 29. The communications path 55 may include direct data transfer lines and high-speed data transfer lines, e.g., a communications bus 18 to effect communications within the control system 10 and effect communications between the control system 10 and elements of the vehicle 5.

The engine 40 can be any internal combustion engine that converts fuel to mechanical power through a combustion process. The first and second torque machines 35 and 36 are any suitable non-combustion torque machines, and preferably include multi-phase electric motor/generators electrically connected to the inverter module 30 that are configured to convert stored electric energy to mechanical power and convert mechanical power to electric energy that may be stored in the energy storage device 25. The inverter module 30 includes first and second inverters 32 and 33 that electrically connect to the first and second torque machines 35 and 36, respectively. The first and second torque machines 35 and 36 interact with the respective first and second inverters 32 and 33 to convert stored electric energy to mechanical power and convert mechanical power to electric energy that may be stored in the energy storage device 25. The transmission 50 preferably includes one or more differential gear sets and activatable clutch components to effect torque transfer between the engine 40, the first and second torque machines 35 and 36, and an output member 62 that couples to the driveline 60. The driveline 60 may include a differential gear device 65 that mechanically couples to an axle 64 or half-shaft that mechanically couples to a wheel 66 that transfers tractive torque to propel the vehicle 5. The control system 10 includes a control module 12 that signally connects to an operator interface 14. The operator interface 14 is used to collectively indicate a plurality of human/machine interface devices through which the vehicle operator commands operation of the vehicle 5. The control module 12 signally connects to sensing devices of each of the energy storage device 25, the inverter module 30, the first and second torque machines 35 and 36, the engine 40, and the transmission 50. The control module 12 operatively connects to actuators of the inverter module 30 including the first and second inverters 32 and 33, the engine 40, and the transmission 50 either directly or via the communications bus 18 to control operation thereof in accordance with executed control schemes that are stored in the form of algorithms and calibrations.

Control module, module, control, controller, control unit, processor and similar terms mean any suitable one or various combinations of one or more of Application Specific Integrated Circuit(s) (ASIC), electronic circuit(s), central processing unit(s) (preferably microprocessor(s)) and associated memory and storage (read only, programmable read only, random access, hard drive, etc.) executing one or more software or firmware programs, combinational logic circuit(s), input/output circuit(s) and devices, appropriate signal conditioning and buffer circuitry, and other suitable components to provide the described functionality. Software, firmware, programs, instructions, routines, code, algorithms and similar terms mean any instruction sets including calibrations and look-up tables. The control module has a set of control routines including resident software program instructions and calibrations stored in memory and executed to provide the desired functions, including control scheme 300. The routines are preferably executed during preset loop cycles. Routines are executed, such as by a central processing unit, and are operable to monitor inputs from sensing devices and other networked control modules, and execute control and diagnostic routines to control operation of actuators. Loop cycles may be executed at regular intervals, for example each 3.125, 6.25, 12.5, 25 and 100 milliseconds during ongoing engine and vehicle operation. Alternatively, routines may be executed in response to occurrence of an event.

Figures 1, 2:
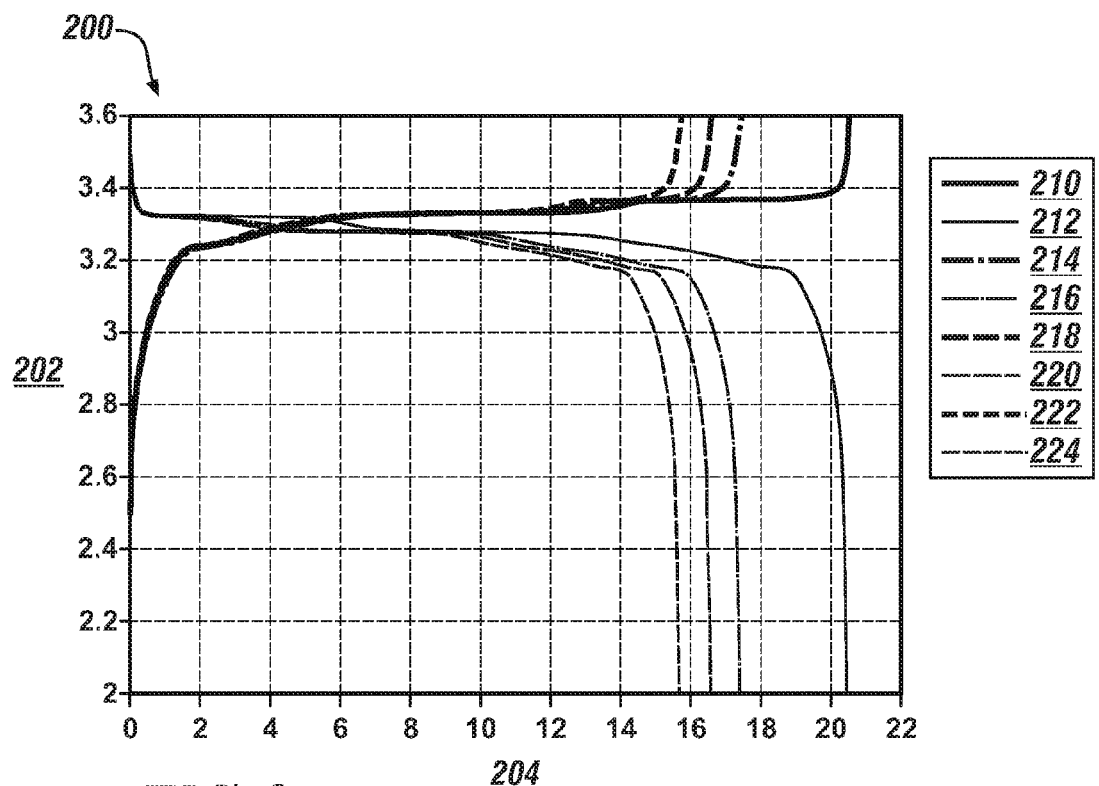
Figure 2:
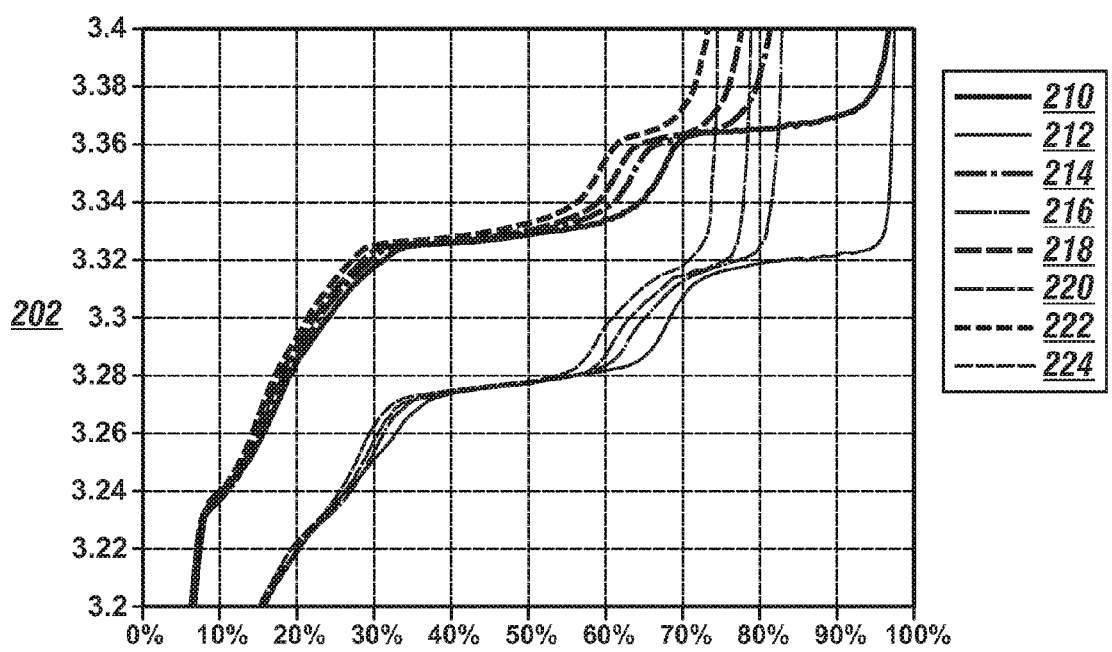

FIG. 2-1 graphically shows data associated with charging and discharging a representative sample of the battery 25 at different states of health (SOH). SOH can be defined relative to a discharge capacity of the battery, which is dependent on the charge capacity and coulombic efficiency. For known lithium ion batteries, the coulombic efficiency is very good (~99.5%), leading to a discharge capacity that is close to a charge capacity. The total discharge capacity can be measured or inferred from the charge capacity and the SOC window, i.e., charging from a low SOC to a high SOC, and calculated as follows:

$$TDC = CE \times (CC/SOC\ window) \qquad [1]$$

wherein
TDC is a total discharge capacity,
CE is coulombic efficiency,
CC is charge capacity, and SOC window is defined by the charging window from low SOC to high SOC.

A battery has a high SOH in a fresh state when it is at or near its initial discharge capacity when fully charged, e.g., 98% of its initial discharge capacity when fully charged, and has a low SOH at an end of service life when there is a significant calibratable degradation in the discharge capacity when fully charged. In one embodiment, a battery is at an end of service life when it is at or near 75% of its initial discharge capacity when fully charged. The percentages described with reference to FIGS. 2-1 through 2-4 are percentages of the total initial discharge capacity, with 98% is associated with a high SOH, near the beginning of life, and 75% is associated with a low SOH, closer to the end of life, with the definition of end of life specific to an application. In the embodiment described, the battery has lost 2% and 25% of the total capacity, respectively.

The representative battery is a cell composed from lithium (LiFePO4) that is charged at a C/10 (slow) rate, meaning the electrical current charging rate is metered to achieve a full charge in 10 hours. The data includes measured voltage (V) 202 on the vertical axis plotted in relation to a battery charge capacity Q (Amp-hours) 204 on the horizontal axis for battery charging events, shown as lines 210, 214, 218 and 222, and battery discharging events, shown as lines 212, 216, 220 and 224. As shown, the data includes the battery at a fresh state, i.e., at 98% of its initial discharge capacity in a charging state 210 and a discharging state 212, at 84% of its initial discharge capacity in a charging state 214 and a discharging state 216, at 79% of its initial discharge capacity in a charging state 218 and a discharging state 220, and at 75% of its initial discharge capacity in a charging state 222 and a discharging state 224. In one embodiment, a battery is considered at its end of life when it reaches 75% of its initial discharge capacity. Aging is achieved by repetitively executing charge/discharge cycles. The voltage response is nearly flat (i.e., varies less than 0.2 V) during most of the charge and discharge throughout the life of the battery when operating within the voltage range of operation, which is between 2.0V and 3.6 V in one embodiment.

FIG. 2-2 shows the data of FIG. 2-1 associated with charging and discharging the representative sample of the battery 25 at different states of health, with the data expanded in the nearly flat voltage region to include the measured voltage (V) 202 on the vertical axis plotted in relation to percent of initial discharge capacity (%) 205 on the horizontal axis for battery charging events and battery discharging events, with the percent of initial discharge capacity (%) determined based upon the battery capacity (Amp-hours) shown with reference to FIG. 2-1. Each of the plotted data lines shows regions having nearly flat voltage plateaus. As shown, there are two distinct voltage plateaus due to the phase transitions in the active materials of the battery. By way of example, when the battery is a lithium-based device, each phase transition correlates to lithium intercalation and de-intercalation as the battery discharges and charges, respectively.

Figures 2, 3:
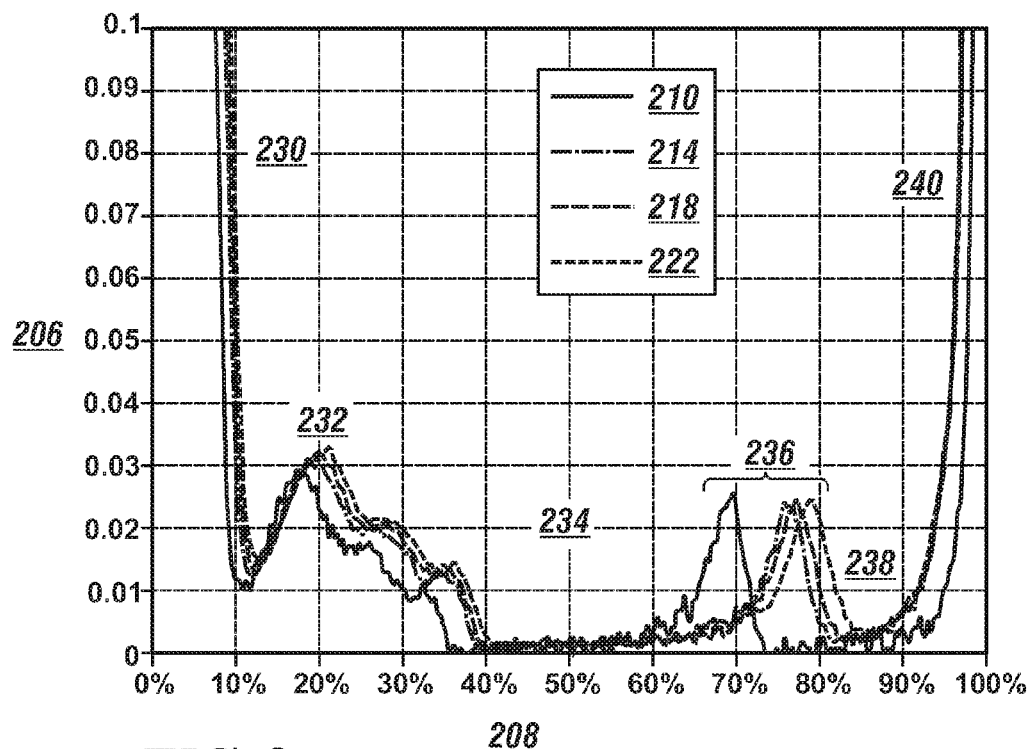

FIG. 2-3 shows the data of FIG. 2-1 associated with charging the representative sample of the battery 25 at different states of health, with the analyzed data including a derivative of the voltage response with respect to the charge input dV/dQ (V/A-h) 206 on the vertical axis plotted in relation to a state of charge of the battery (%) on the horizontal axis 208 during a low current charging event. The results can be correlated in terms of an in-rush portion 230, a first peak 232, a first flat region 234, a second peak 236, a second flat region 238, and a final peak 240. The peaks and flat regions provide indicators of the state of charge of the battery. Aging and degradation of the representative battery is readily detectable with reference to the first flat region 234 and the second peak 236. The changes are correlatable to changes in phase transition of the active material(s) of the battery, e.g., changes in the phase transition of the lithium in one embodiment.

Figures 2, 3, 4:
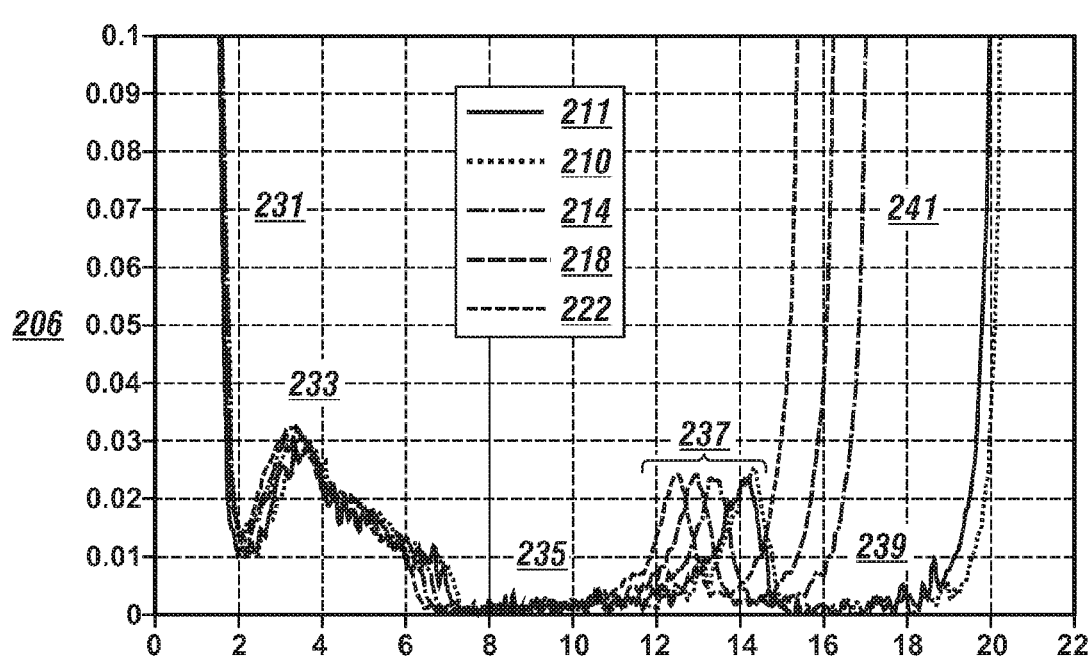
Figure 3:
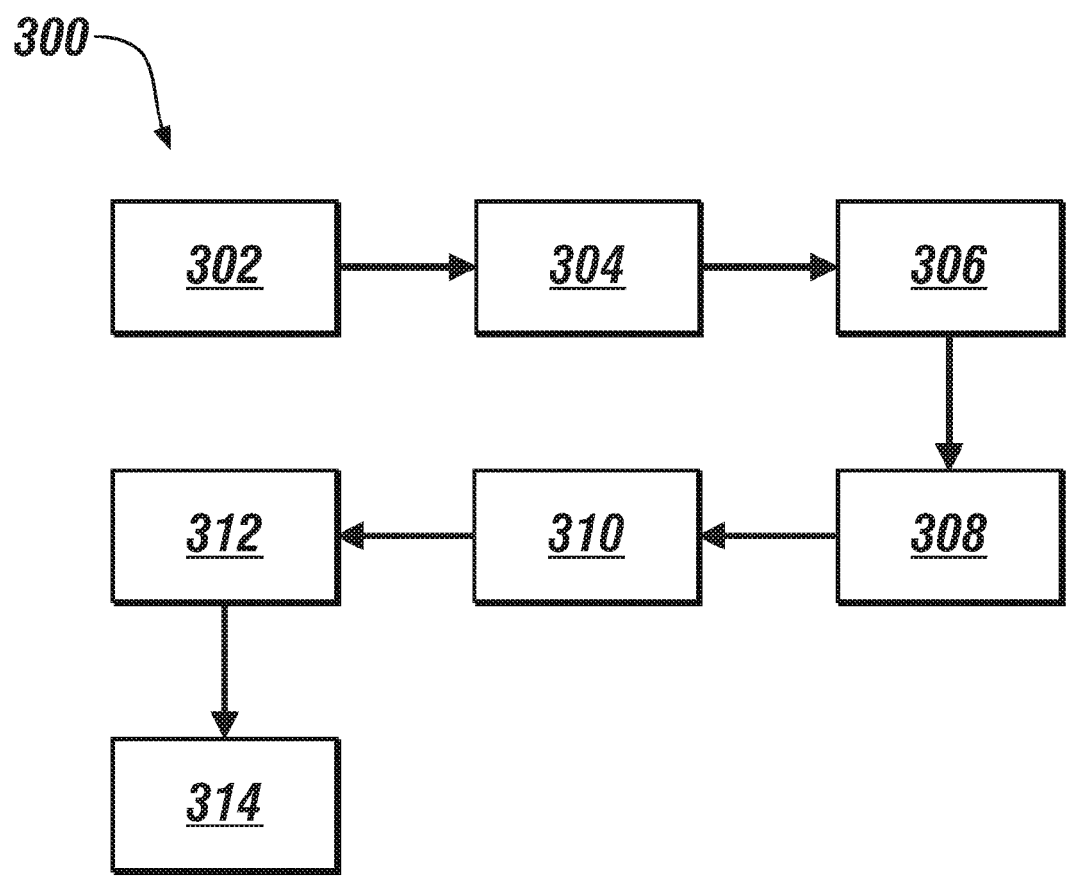

FIG. 2-4 shows the data of FIG. 2-1 associated with charging the representative sample of the battery 25 at different states of health, with the analyzed data including the derivative of the voltage response with respect to the charge input dV/dQ (V/A-h) 206 on the vertical axis plotted in relation to the battery charge capacity Q (Amp-hours) 204 during the low current charging event. As shown, the data includes the battery at the fresh state, i.e., at 98% of its initial capacity in a charging state 210 and at 97% of its initial discharge capacity in a charging state 211, at 84% of its initial discharge capacity in a charging state 214, at 79% of its initial discharge capacity in a charging state 218, and at 75% of its initial discharge capacity in a charging state 222. The results can be analyzed in terms of an in-rush portion 231, a first peak 233, a first flat region 235, a second peak 237, a second flat region 239, and a final peak 241, which correspond to the analogous results shown with reference to FIG. 2-3. These results demonstrate a shift in the differential voltage peaks relative to the charge capacity, i.e., the second peak 237 and the final peak 241, shift in relation to the battery charge capacity Q 204 and the extent of the charge capacity associated with the flat region 239 decreases as the battery ages. Both sets of data provide repeatable indicators for the present charge capacity, which can be used to determine a state of charge (SOC) and a state of health (SOH) of the battery. The data shown at 97% of its initial discharge capacity in a charging state 211 is associated with a battery charger that is operating in a constant power mode instead of constant current mode, and indicates that the differential voltage analysis is valid at low power, e.g., for a 10 Watt/cell, which can charge the cell in less than 8 hours in this embodiment.

FIG. 3 schematically shows a differential voltage analysis scheme 300, which executes differential voltage analysis during a battery charging event, and is applicable to any electrochemical battery configuration demonstrating a flat voltage response during charging and discharging events, e.g., a lithium iron phosphate (LiFePO$_4$) battery configuration employed as described with reference to FIG. 1. The differential voltage analysis scheme 300 is set forth in detail in Table 1 which is provided as a key to FIG. 3 wherein the numerically labeled blocks and the corresponding functions are set forth as follows.

TABLE 1

| BLOCK | BLOCK CONTENTS |
| --- | --- |
| 302 | Initiate battery charging |
| 304 | Monitor battery temperature, current, voltage, and time during charging |
| 306 | Determine charge capacity Q by integrating charge current |
| 308 | Execute differential voltage analysis: dV/dQ |
| 310 | Evaluate dV/dQ in relation to charge capacity Q |
| 312 | Correlate peaks of dV/dQ to SOC, SOH |
| 314 | Apprise control scheme and operator of SOC, SOH of battery |

The differential voltage analysis scheme 300 is preferably executed subsequent to initiating battery charging (302). Preferably the charging includes low current charging, e.g., at a charging rate that is ≤C/3, which is a three-hour charging rate. In one embodiment, the charging rate is C/10. In one embodiment, the low current charging is executed when the battery is employed on a vehicle, e.g., as described with reference to FIG. 1, when the vehicle is in a static setting such as when plugged in to an extra-vehicle charging station. During the charging, battery and charging parameters are monitored, including battery temperature, charging current, voltage and time (304), and battery charge capacity Q is determined by integrating the charging current I in relation to time t (306) as follows.

$$Q = \int I dt \qquad [2]$$

A differential voltage analysis is executed, including taking the derivative of the voltage response with respect to change in charge capacity (dV/dQ) during the low current charge event (308), with the results evaluated in relation to the charge capacity Q (310). Exemplary results of taking the derivative of the voltage response with respect to change in charge capacity (dV/dQ) in relation to the charge capacity (Q) are shown with reference to FIG. 2-4. The evaluation preferably includes correlating location of the peaks of the derivative of the voltage response with respect to change in charge capacity (dV/dQ) to a state of charge and a state of health of the battery. By way of example, FIG. 2-4 graphically depicts a shift in differential voltage peaks relative to the charge capacity Q, i.e., second peak 237 and final peak 241 for the battery at the fresh state, i.e., at 98% of its initial capacity in a charging state 210, at 84% of its initial discharge capacity in a charging state 214, at 79% of its initial discharge capacity in a charging state 218, and at 75% of its initial discharge capacity in a charging state 222, i.e., near an end of service life. As the battery capacity degrades with life, the second differential voltage peak shifts in relation to the charge input. The battery charge capacity at the second peak 237 of the differential voltage correlates to a state of charge of the battery, providing a repeatable indicator of the battery capacity, i.e., a state of charge (SOC), which can be translated into a vehicle driving range, and a battery state of health (SOH). One having ordinary skill in the art is able to correlate the shift in the second differential voltage peak in relation to the charge input for an application of the battery to determine a state of charge (SOC) and a battery state of health (SOH), which is a repeatable indicator of the battery capacity in the application. FIG. 2-4 shows a non-limiting example that graphically depicts such a result. When the second peak of the differential voltage occurs at a battery charge capacity (shown on the horizontal axis) that is greater than 14 Amp-hours, the battery SOH indicates the battery is relatively fresh or new. When the second peak of the differential voltage occurs at a battery charge capacity that is approaching 12 Amp-hours, the battery SOH indicates the battery is approaching end-of-life, with such information useable to inform a vehicle operator when the battery is employed as part of a vehicle propulsion system. The voltage inflections indicated by the differential voltage peaks are caused by phase transitions of the active materials during lithium de-intercalation and intercalation. A low rate discharge may be impractical during vehicle operation, but a low rate charge can be implemented during off-cycle charging at an extra-vehicle charging station and is suitable for this application.

The results of the differential voltage analysis scheme 300 are communicated to a vehicle control scheme for controlling operation and are preferably communicated to the vehicle operator (314). This can include translating the state of charge (SOC) into a vehicle driving range, which can be communicated to the vehicle operator. This can include informing the vehicle operator when the battery SOH indicates the battery is reaching the end of its service life. The differential voltage analysis scheme 300 can be integrated into a vehicle or into battery charger hardware and periodically executed to measure cell voltage, e.g., at every 0.5% SOC which occurs every 2-3 minutes at a C/10 current charging rate. The differential voltage analysis scheme 300 can be employed to identify a weakest cell in an array of cells.

The disclosure has described certain preferred embodiments and modifications thereto. Further modifications and alterations may occur to others upon reading and understanding the specification. Therefore, it is intended that the disclosure not be limited to the particular embodiment(s) disclosed as the best mode contemplated for carrying out this disclosure, but that the disclosure will include all embodiments falling within the scope of the appended claims.

The invention claimed is:

1. A computer-implemented method for evaluating a battery employed in an application, comprising:
   during a charging event,
      monitoring a voltage response with respect to a charge input for the battery;
      monitoring a battery charging current for the battery;
      determining a battery charge capacity based upon the monitored battery charging current for the battery;
      determining a derivative of the voltage response with respect to the change in battery charge capacity;
      identifying a first peak in the derivative of the voltage response corresponding to a low battery charge capacity;
      identifying a second peak in the derivative of the voltage response corresponding to a high battery charge capacity;
      determining a state of charge of the battery based upon the second peak; and
      determining a state of health of the battery based upon the battery charge capacity at which the second peak occurs, including;
         determining threshold battery charge capacities indicative of battery state of health levels; and
         comparing the battery charge capacity at which the second peak occurs with the determined threshold battery charge capacities indicative of battery state of health levels; and
   controlling operation of the application in response to the state of charge and the state of health.

2. The method of claim 1, wherein the charging event comprises a low current charging event.

3. The method of claim 1, wherein determining a state of health of the battery comprises:
   estimating a decreasing state of health based upon the second peak occurring at decreasing battery charge capacity values.

4. A system for evaluating a battery employed in an application, comprising:
   the battery;
   a computerized control module, including programming configured to:
      during a charging event,
         monitor a voltage response with respect to a charge input for the battery;
         monitor a battery charging current for the battery;
         determine a battery charge capacity based upon the monitored battery charging current for the battery;
         determine a derivative of the voltage response with respect to the change in battery charge capacity;
         identify a first peak in the derivative of the voltage response corresponding to a low battery charge capacity;
         identify a second peak in the derivative of the voltage response corresponding to a high battery charge capacity;
         determine a state of charge of the battery based upon the second peak; and
         determine a state of health of the battery based upon the battery charge capacity at which the second peak occurs, including;
            determining threshold battery charge capacities indicative of battery state of health levels; and
            comparing the battery charge capacity at which the second peak occurs with the determined threshold battery charge capacities indicative of battery state of health levels; and
      control operation of the application in response to the state of charge.

* * * * *